United States Patent
Rho

(10) Patent No.: US 10,317,716 B2
(45) Date of Patent: Jun. 11, 2019

(54) DISPLAY APPARATUS AND RELATED MANUFACTURING METHOD

(71) Applicant: Samsung Display Co., Ltd., Yongin-si, Gyeonggi-Do (KR)

(72) Inventor: Sooguy Rho, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/391,644

(22) Filed: Dec. 27, 2016

(65) Prior Publication Data
US 2017/0184897 A1 Jun. 29, 2017

(30) Foreign Application Priority Data

Dec. 28, 2015 (KR) ........................ 10-2015-0187900

(51) Int. Cl.
| | |
|---|---|
| *G02F 1/1333* | (2006.01) |
| *G02F 1/1335* | (2006.01) |
| *G02F 1/1343* | (2006.01) |
| *G02F 1/1345* | (2006.01) |
| *G02F 1/1368* | (2006.01) |
| *H01L 27/32* | (2006.01) |

(52) U.S. Cl.
CPC ...... *G02F 1/13338* (2013.01); *G02F 1/13439* (2013.01); *G02F 1/13452* (2013.01); *G02F 1/13458* (2013.01); *G02F 1/133345* (2013.01); *G02F 1/133528* (2013.01); *H01L 27/323* (2013.01); *G02F 1/1368* (2013.01); *G02F 1/133514* (2013.01); *G02F 2202/28* (2013.01); *H01L 27/3276* (2013.01); *H01L 27/3288* (2013.01)

(58) Field of Classification Search
CPC .................. G02F 1/13338; G02F 1/13458
See application file for complete search history.

(56) References Cited

U.S. PATENT DOCUMENTS

| | | | |
|---|---|---|---|
| 2005/0136604 A1* | 6/2005 | Al-Bayati | H01J 37/321 438/301 |
| 2008/0032235 A1* | 2/2008 | Chang | H01L 27/1214 430/313 |

(Continued)

FOREIGN PATENT DOCUMENTS

| | | |
|---|---|---|
| KR | 10-2009-0028626 A | 3/2009 |
| KR | 10-2011-0061746 A | 6/2011 |
| KR | 10-2015-0001965 A | 1/2015 |

*Primary Examiner* — Alexander P Gross
(74) *Attorney, Agent, or Firm* — Innovation Counsel LLP

(57) ABSTRACT

A display apparatus may include a display panel, a touch electrode, a connecting pad, a first inorganic insulation layer, and a second inorganic insulation layer. The display panel may display an image according to image data. The touch electrode and the connecting pad may be formed of the same conductive material and may be spaced from each other. The first inorganic insulation layer may be positioned between the display panel and the touch electrode and may directly contact each of the touch electrode and the connecting pad. The second inorganic insulation layer may directly contact each of the first inorganic insulation layer and the touch electrode. The touch electrode may be covered by the second inorganic insulation layer. The connecting pad may be positioned between two portions of the second inorganic insulation layer and have a side not covered by the second inorganic insulation layer.

14 Claims, 12 Drawing Sheets

(56) References Cited

U.S. PATENT DOCUMENTS

| | | | |
|---|---|---|---|
| 2008/0180627 A1* | 7/2008 | Yasuda | G02F 1/13452 349/152 |
| 2010/0085499 A1* | 4/2010 | Hirato | G02F 1/136213 349/39 |
| 2012/0038595 A1* | 2/2012 | Park | G06F 3/044 345/176 |
| 2013/0329167 A1* | 12/2013 | Iwanami | G02F 1/1334 349/86 |
| 2016/0098120 A1* | 4/2016 | Miyake | G06F 3/044 345/174 |

* cited by examiner

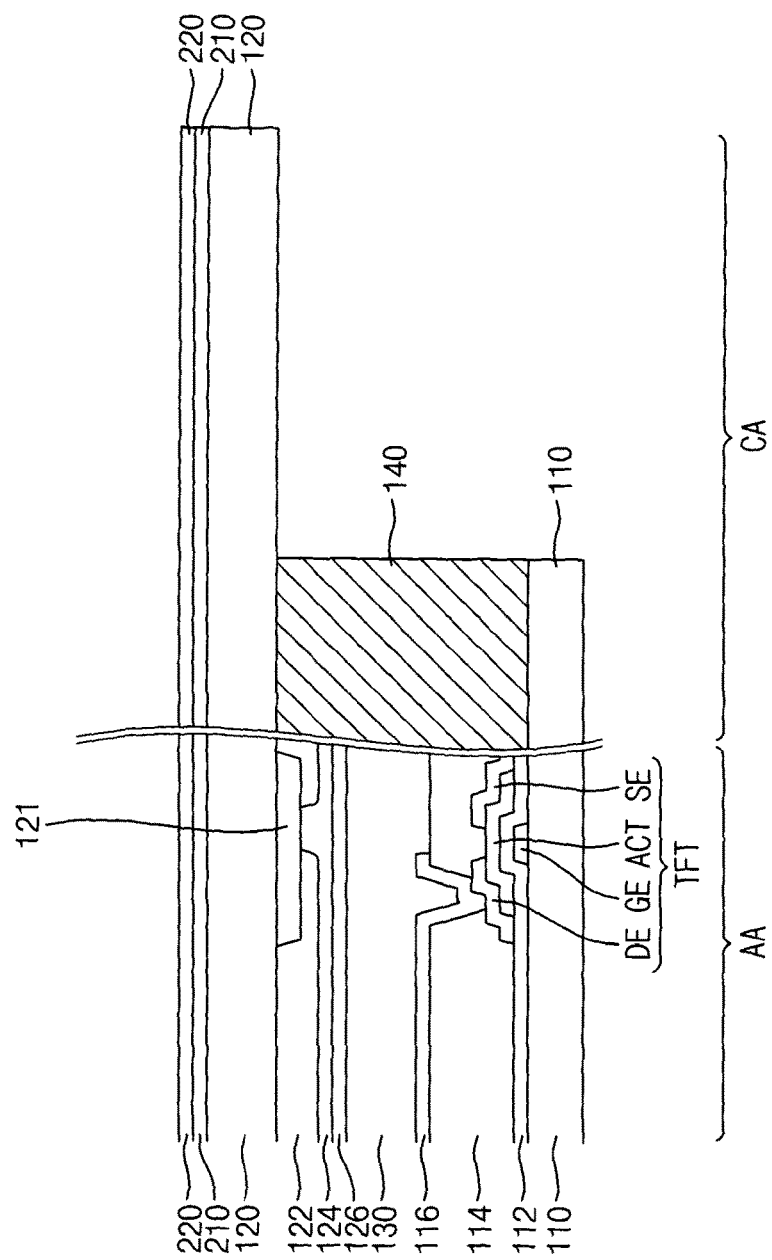

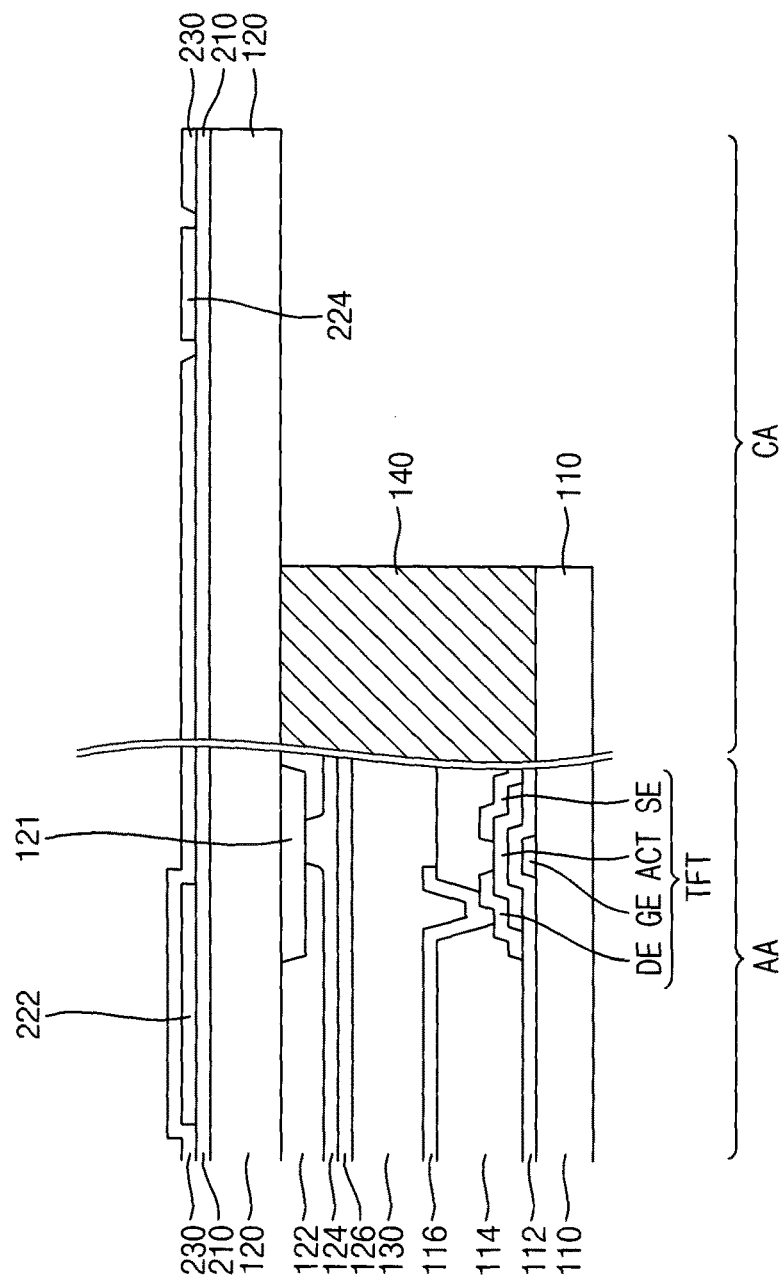

DISPLAY APPARATUS AND RELATED MANUFACTURING METHOD

CROSS-REFERENCE TO RELATED APPLICATION

This application claims priority to and the benefit of Korean Patent Application No. 10-2015-0187900, filed on Dec. 28, 2015; the Korean Patent Application is incorporated by reference herein.

BACKGROUND

Field

The technical field is related to a display apparatus and a method of manufacturing the display apparatus.

Description of Related Art

A display apparatus may display an image according to received image data. For example, according to image data, a liquid crystal display apparatus may apply a voltage to change molecular arrangement of liquid crystal molecules in a display panel for controlling light transmission. By controlling light transmission, the liquid crystal display apparatus may display an image.

The display apparatus may include a touch panel for sensing a touch provided by a user.

SUMMARY

Embodiments may be related to a display apparatus, e.g., a liquid crystal display apparatus, including a touch sensor.

Embodiments may be related to a method of manufacturing the display apparatus.

According to an embodiment, a liquid crystal display apparatus includes the following elements: a first substrate including a first base substrate and a thin film transistor disposed on the first base substrate, a second substrate including a second base substrate facing the first substrate, a liquid crystal layer disposed between the first substrate and the second substrate, a first inorganic insulation layer disposed on the second base substrate opposite to the liquid crystal layer with respect to the second base substrate, a touch electrode disposed on the first inorganic insulation layer, and disposed in an active area which is capable of touch input, a connecting pad disposed on the first inorganic insulation layer, and disposed in a connecting area adjacent to an edge of the active area, and a second inorganic insulation layer disposed on the touch electrode and the first inorganic insulation layer, and defining an opening which exposes the connecting pad.

In an embodiment, the opening may be larger than the connecting pad. The first inorganic insulation layer may be exposed between the connecting pad and the second inorganic insulation layer.

In an embodiment, the touch electrode and the connecting pad may be connected by a connecting line disposed between the first inorganic insulation layer and the second inorganic insulation layer. The touch electrode, the connecting pad and the connecting line include transparent conductive material, and may be formed from a same layer.

In an embodiment, the liquid crystal display apparatus may further include a flexible printed circuit board including a drive IC which is electrically connected to the connecting pad and detect user's touch position by driving the touch electrode.

In an embodiment, the liquid crystal display apparatus may further include a polarizer disposed on the second inorganic insulation layer in the active area, and an adhesive layer disposed between the polarizer and the second inorganic insulation layer.

In an embodiment, a portion of the second inorganic insulation layer in the connecting area may be exposed to outside.

According to an embodiment, a method of manufacturing a liquid crystal display apparatus includes the following steps: providing a first substrate, providing a second substrate, forming a liquid crystal layer between the first substrate and the second substrate, forming a first inorganic insulation layer on the second substrate after forming the liquid crystal layer, forming a transparent conductive layer on the first inorganic insulation layer, forming a first photoresist pattern and a second photoresist pattern having a larger thickness than the first photoresist pattern on the transparent conductive layer, forming a touch electrode under the first photoresist pattern and a connecting pad under the second photoresist pattern by patterning the transparent conductive layer using the first and second photoresist patterns, removing the first photoresist pattern, forming a second inorganic insulation layer on the touch electrode, the first inorganic insulation layer and the second photoresist pattern, and removing the second photoresist pattern and a portion of the second inorganic insulation layer on the second photoresist pattern.

In an embodiment, in forming the touch electrode and the connecting pad, a width of the second photoresist pattern may be larger than a width of the connecting pad in a cross-sectional view, so that an under-cut may be formed between the second photoresist pattern and the connecting pad.

In an embodiment, forming the touch electrode and the connecting pad may be performed by a wet-etch process.

In an embodiment, the second inorganic insulation layer may define an opening exposing the connecting pad. The opening may be larger than the connecting pad configured to expose a portion of the first inorganic insulation layer adjacent to the connecting pad.

In an embodiment, forming the first and second photoresist patterns may include forming a photoresist layer on the transparent conductive layer, and performing exposure and development of photoresist layer using a half-tone mask.

In an embodiment, the first inorganic insulation layer and the second inorganic insulation layer may include silicon oxide (SiOx) or silicon nitride (SiNx).

In an embodiment, each of forming the first inorganic insulation layer and forming the second inorganic insulation layer may be performed by a chemical vapor deposition process.

In an embodiment, the chemical vapor deposition process may be performed below 130 degrees Celsius.

In an embodiment, forming the first inorganic insulation layer, forming the transparent conductive layer, forming the first and second photoresist patterns, forming the touch electrode and the connecting pad, removing the first photoresist pattern, forming the second inorganic insulation layer, and removing the second photoresist pattern may be all performed below 130 degrees Celsius.

In an embodiment, removing the first photoresist pattern may include removing the first photoresist pattern which has relative small thickness by overall ashing process to the first and second photoresist patterns, and remaining the second photoresist pattern which has relative large thickness.

In an embodiment, differences of refractive indexes among the first inorganic insulation layer, the second inorganic insulation layer and the transparent conductive layer may be less than 0.1.

In an embodiment, the second inorganic insulation layer may have a substantially level upper surface.

In an embodiment, the first substrate may include a thin film transistor, and the second substrate may include color filter.

In an embodiment, the method may further include connecting a flexible printed circuit board to the connecting pad, and attaching a polarizer on the second inorganic insulation layer.

An embodiment may be related to a display apparatus. The display apparatus may include a display panel, a touch electrode, a connecting pad, a first inorganic insulation layer, and a second inorganic insulation layer. The display panel may display an image according to image data by performing at least one of light transmission, light reflection, and light emission. The touch electrode may be formed of a conductive material. The connecting pad may be formed of the conductive material and may be spaced from the touch electrode. The first inorganic insulation layer may be positioned between the display panel and the touch electrode and may directly contact each of the touch electrode and the connecting pad. The second inorganic insulation layer may directly contact each of the first inorganic insulation layer and the touch electrode. The touch electrode may be positioned between the first inorganic insulation layer and the second inorganic insulation layer and may be covered by the second inorganic insulation layer. The connecting pad may be positioned between two portions of the second inorganic insulation layer and may have at least one side not covered by the second inorganic insulation layer.

Each of the two portions of the second inorganic insulation layer may be spaced from the connecting pad without directly contacting the connecting pad.

The display apparatus may include a connecting line. The connecting line may be formed of the conductive material and may be positioned between the first inorganic insulation layer and the second inorganic insulation layer. The touch electrode may be electrically connected through the connecting line to the connecting pad.

The display apparatus may include a printed circuit board. The printed circuit board may include a driving circuit and may be electrically connected to the connecting pad. The connecting pad and the two portions of the second inorganic insulation layer may be positioned between the first inorganic insulation layer and the printed circuit board.

The display apparatus may include a conductive sealing member. The conductive sealing member may directly contact each of the printed circuit board and the connecting pad and may directly contact at least one of the first inorganic insulation layer and the second inorganic insulation layer.

The conductive sealing member may directly contact each of the first inorganic insulation layer and the second inorganic insulation layer.

The display apparatus may include a polarizer. The polarizer may partially overlap the second inorganic insulation layer, may cover the touch electrode, may not completely overlap the second inorganic insulation layer, and may not cover the connecting pad.

An embodiment may be related to a method for manufacturing a display apparatus. The method may include preparing a display panel. The display panel may display an image according to image data by performing at least one of light transmission, light reflection, and light emission. The method may include forming a first inorganic insulation layer on the display panel. The method may include forming a touch electrode on the first inorganic insulation layer using a conductive material. The first inorganic insulation layer may be positioned between the display panel and the touch electrode and may directly contact the touch electrode. The method may include forming a connecting pad on the first inorganic insulation layer using the conductive material. The connecting pad may directly contact the first inorganic insulation layer and may be spaced from the touch electrode. The method may include forming a second inorganic insulation layer. The second inorganic insulation layer may directly contact each of the first inorganic insulation layer and the touch electrode. The touch electrode may be positioned between the first inorganic insulation layer and the second inorganic insulation layer and may be covered by the second inorganic insulation layer. The connecting pad may be positioned between two portions of the second inorganic insulation layer and may have at least one side not covered by the second inorganic insulation layer.

The method may include providing a conductive layer on the first inorganic insulation layer. The method may include providing a first photoresist and a second photoresist on a surface of the conductive layer. The second photoresist member may be thicker than the first photoresist member in a first direction. The first direction may be perpendicular to the surface of the conductive layer. The method may include partially removing the conductive layer using the first photoresist member and the second photoresist member as mask members to form the touch electrode and the connecting pad.

The method may include partially removing the second photoresist member to produce a remaining photoresist member when completely removing the first photoresist member to expose the touch electrode. The method may include providing an inorganic insulation material layer. The inorganic insulation material layer comprises the second inorganic insulation layer and an inorganic insulation material portion. The inorganic insulation material portion may be positioned on the remaining photoresist member. The method may include removing the inorganic insulation material portion and the remaining photoresist member to expose the connecting pad.

The second photoresist member may be wider than the connecting pad in a second direction. The second direction may be perpendicular to the first direction. Each of the two portions of the second inorganic insulation layer may be spaced from the connecting pad without directly contacting the connecting pad.

The method may include providing a photoresist layer on the conductive layer. The method may include processing the photoresist layer using a half-tone mask to form the first photoresist member and the second photoresist member.

At least one of the forming the first inorganic insulation layer, the forming the touch electrode, the forming the connecting pad, and the forming the second inorganic insulation layer may be performed below 130 degrees Celsius.

Each of the forming the first inorganic insulation layer, the forming the touch electrode, the forming the connecting pad, and the forming the second inorganic insulation layer may be performed below 130 degrees Celsius.

A difference of refractive indexes of any two of the first inorganic insulation layer, the second inorganic insulation layer, the touch electrode, and the connecting pad may be less than 0.1.

The method may include forming a connecting line using the conductive material when forming the touch electrode and forming the connecting pad. The connecting line may be positioned between the first inorganic insulation layer and the second inorganic insulation layer after formation of the second inorganic insulation layer. The touch electrode may be electrically connected through the connecting line to the connecting pad.

The method may include providing a printed circuit board. The printed circuit board comprises a driving circuit and may be electrically connected to the connecting pad. The connecting pad and the two portions of the second inorganic insulation layer may be positioned between the first inorganic insulation layer and the printed circuit board.

The method may include providing a conductive sealing member. The conductive sealing member may directly contact each of the printed circuit board and the connecting pad and may directly contact at least one of the first inorganic insulation layer and the second inorganic insulation layer.

The conductive sealing member may directly contact each of the first inorganic insulation layer and the second inorganic insulation layer.

Each of the two portions of the second inorganic insulation layer may be thicker than the connecting pad (in the first direction).

The touch electrode may be positioned between the first inorganic insulation layer and a first section of the second inorganic insulation layer and may directly contact each of the first inorganic insulation layer and the first section of the second inorganic insulation layer. A second section of the second inorganic insulation layer may directly contact the first inorganic insulation layer without directly contacting the touch electrode. The second section of the second inorganic insulation layer may be as high as the first section of the second inorganic insulation layer (in the first direction) and may be thicker than first section of the second inorganic insulation layer (in the first direction).

The method may include providing a polarizer on the second inorganic insulation layer. The polarizer partially may overlap the second inorganic insulation layer, may cover the touch electrode, may not completely overlap the second inorganic insulation layer, and may not cover the connecting pad.

According to embodiments, a display apparatus, e.g., a liquid crystal display apparatus, includes a first inorganic insulation layer, a touch electrode, a connecting line, a connecting pad and a second inorganic insulation layer. Differences of refractive indexes associated with the first inorganic insulation layer, the touch electrode, the connecting pad and the second inorganic insulation layer are relative small, so that substantially no conspicuous spot pattern potentially formed due to reflective index differences may be visible or noticeable to users. Advantageously, display quality of the display apparatus having a touch input device may be satisfactory.

In embodiments, a method of manufacturing the display apparatus includes forming first and second photoresist members having different thicknesses, wherein a remaining portion the second photoresist pattern is removed by a lift-off process, so that the overall process can be substantially simple, efficient, and/or effective.

In embodiments, the touch electrode and the connecting line are formed on the first inorganic insulation layer, so that defects potentially caused by particles formed from a previous process may be minimized or substantially prevented.

BRIEF DESCRIPTION OF THE DRAWINGS

FIG. 5A, FIG. 5B, FIG. 5C, FIG. 5D, FIG. 5E, FIG. 5F, FIG. 5G, and FIG. 5H are cross-sectional views illustrating a method of manufacturing a display apparatus, e.g., a liquid crystal display apparatus, according to one or more example embodiments.

DETAILED DESCRIPTION OF EMBODIMENTS

Embodiments are described with reference to the accompanying drawings. Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively. The term "pattern" may mean "member".

Figure 1:
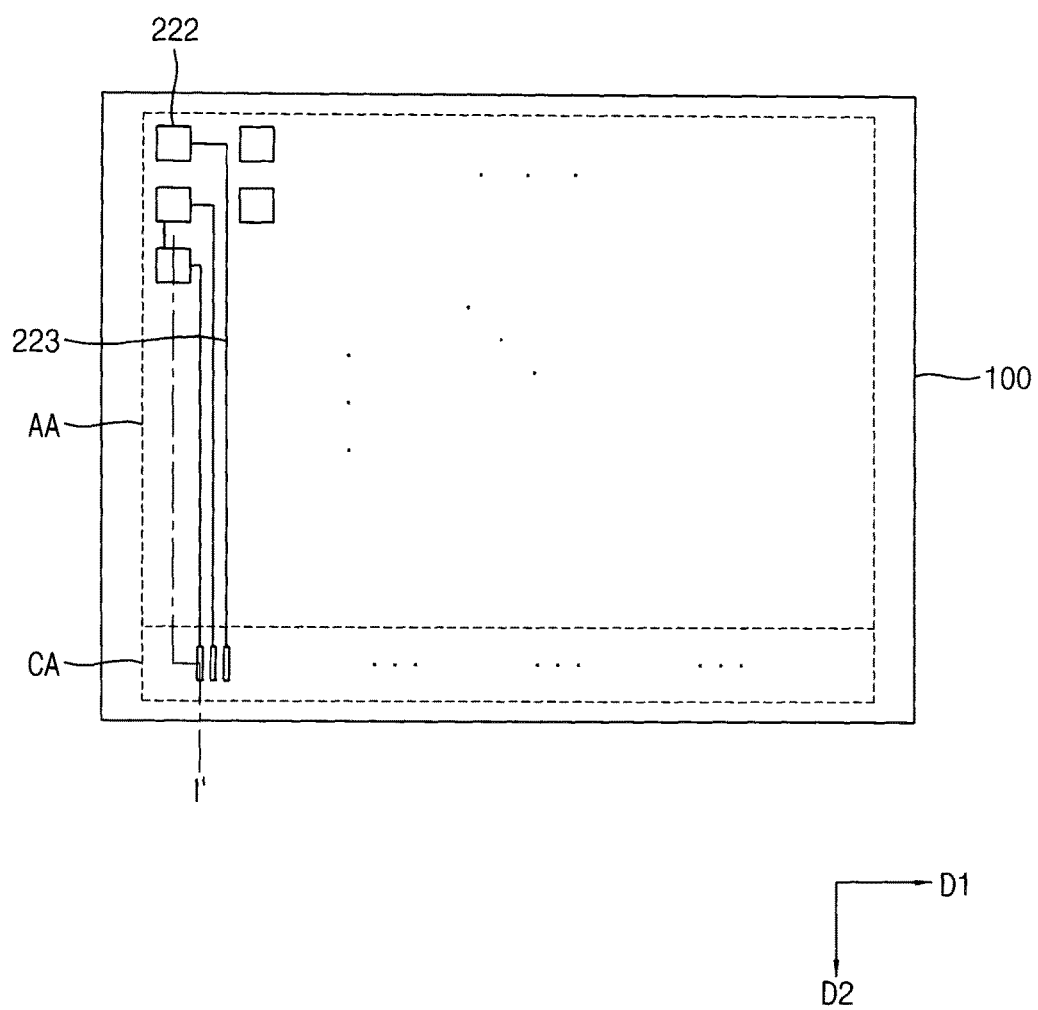
FIG. 1 is a plan view illustrating a display apparatus, e.g., a liquid crystal display apparatus, according to an example embodiment.
Figure 2:
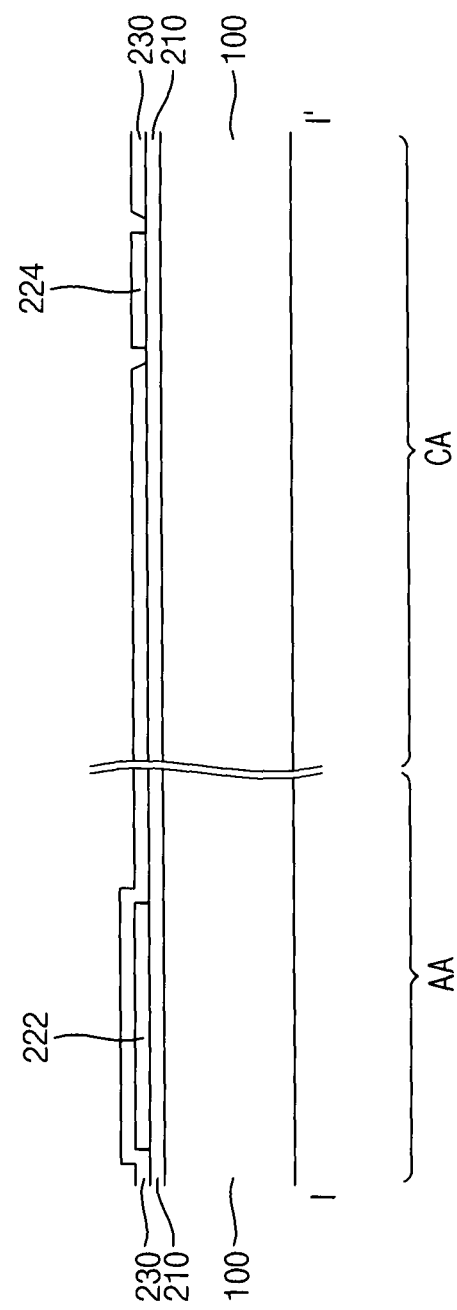
FIG. 2 is a cross-sectional view taken along a line I-I' of FIG. 1 according to an example embodiment.

FIG. 1 is a plan view illustrating a display apparatus, e.g., a liquid crystal display apparatus, according to an example embodiment. FIG. 2 is a cross-sectional view taken along a line I-I' of FIG. 1 according to an example embodiment.

FIG. 1 is a plan view illustrating a display apparatus according to an example embodiment.

Referring to FIGS. 1 and 2, the display apparatus includes a display panel 100, a first inorganic insulation layer 210, a plurality of touch electrodes 222, a plurality of connecting pads 224, and a second inorganic insulation layer 230.

The display panel 100 may display an image according to image data by performing at least one of light transmission, light reflection, and light emission. The display panel 100 may be a liquid crystal display panel which displays an image by applying a voltage difference to a specific arrangement of liquid crystal molecules in a liquid crystal layer of the liquid crystal display panel. The display panel 100 may be or may include a display panel that is not a liquid crystal display panel. For example, the display panel 100 may be or may include an organic light emitting display panel.

For example, a first substrate, a second substrate facing the first substrate and a liquid crystal layer between the first substrate and the second substrate. Detailed will be mentioned in FIG. 3. An upper surface of the display panel 100 may be one of surfaces of the base substrate.

The first base substrate may include a transparent insulation substrate. For example, the first base substrate may include a glass substrate, a quartz substrate, a transparent resin substrate, etc. Examples of the transparent resin substrate for the first base substrate may include polyimide-based resin, acryl-based resin, polyacrylate-based resin, polycarbonate-based resin, polyether-based resin, sulfonic acid containing resin, polyethyleneterephthalate-based resin, etc.

The first inorganic insulation layer 210 may be disposed on the display panel 100. The first inorganic insulation layer 210 may include an inorganic insulation material. For example, the first inorganic insulation layer 210 may include silicon oxide (SiOx) or silicon nitride SiNx. When, the first inorganic insulation layer 210 includes silicon nitride SiNx, refractive index of the first inorganic insulation layer 210 may be about 2.0. The first inorganic insulation layer 210 may cover entire of an upper surface of the display panel 100.

The touch electrode 222 may be disposed in an active area AA of the display panel 100. The active area AA may be an area where touch input of user is possible. In a plan view, a plurality of touch electrodes 222 may be arranged in a first direction D1 and a second direction D2. The second direction D2 may cross the first direction D1. For example, the second direction D2 may be substantially perpendicular to the first direction D1. The touch electrode 222 may include a transparent conductive material. For example, the touch electrode 222 may include indium tin oxide ITO. When the touch electrode 222 includes indium tin oxide ITO, a refractive index of the touch electrode 222 may be about 1.9 to 2.0.

The connecting pad 224 may be disposed in a connecting area CA of the display panel 100. The connecting area CA may be adjacent to the active area AA, and an element for sensing use's touch input may be connected to the display apparatus in the connecting area CA. In a plan view, the connecting area CA may be disposed adjacent to an edge of the display panel 100. A plurality of connecting pads 224 may be arranged along extending direction of the connecting area CA.

The connecting pad 224 and touch electrode 222 may include same material, and may be formed a same layer. For example, the connecting pad 224 may include indium tin oxide ITO.

Each of the connecting pad 224 may be electrically connected to the touch electrode 222 through a connecting line 223. Thus, a plurality of connecting lines 223 may connect the plurality of pads 224 to the plurality of touch electrodes 222, respectively.

The touch electrode 222 may be electrically connected to a drive IC (not shown) through the connecting lines 223 and the connecting pads 224. The drive IC may sense a touch signal from the touch electrode, so that may detect a touch point.

The connecting lines 223 and the touch electrode 222 may include same material, and may be formed a same layer. For example, the connecting lines 223 may include indium tin oxide ITO.

The second insulation layer 230 may be disposed on the first inorganic insulation layer 210, the touch electrode 222 and the connecting lines 223. The second insulation layer 230 may include an inorganic insulation material. For example, the second inorganic insulation layer 230 may include silicon oxide (SiOx) or silicon nitride SiNx. When, the second inorganic insulation layer 230 includes silicon nitride SiNx, refractive index of the second inorganic insulation layer 230 may be about 2.0.

The second the second inorganic insulation layer 230 may be uniformly formed on the first inorganic insulation layer 210 along a profile of the touch electrode 222 and the connecting lines 223. In an embodiment, the second inorganic insulation layer 230 may have a substantially small thickness, such that a stepped portion may be formed at a portion of the touch electrode 222 and the connecting lines 223.

The second inorganic insulation layer 230 may define an opening which exposes the connecting pad 224. In a plan view, the opening may be formed larger than the connecting pad 224. Accordingly, the second inorganic insulation layer 230 may be spaced apart from the connecting pad 224, and a portion of the first inorganic insulation layer 210 between the connecting pad 224 and an edge of the opening may be exposed.

According to embodiments, differences of reflective indexes of the first inorganic insulation layer 210, the touch electrode 222, the connecting lines 223 and the second inorganic insulation layer 230 may be less than 0.1, so that spot pattern formed due to reflective index differences may be minimized or substantially prevented, so that substantially no conspicuous spot pattern may be visible or noticeable to users. Advantageously, satisfactory display quality of the display apparatus having the touch input device may be attained.

Figure 3:
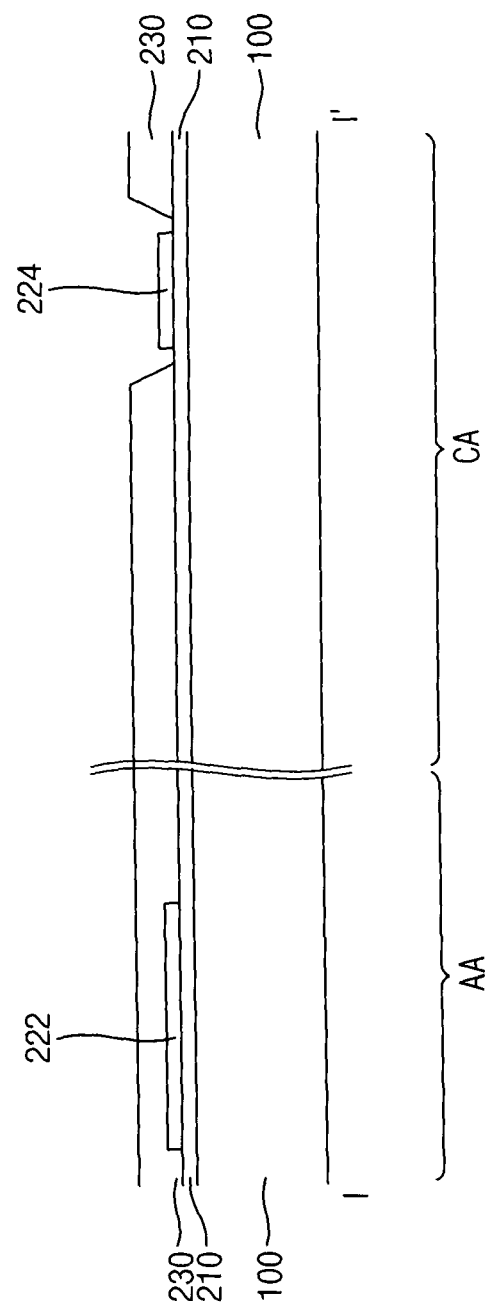
FIG. 3 is a cross-sectional view illustrating a display apparatus, e.g., a liquid crystal display apparatus, according to an example embodiment.

FIG. 3 is a cross-sectional view illustrating a display apparatus, e.g., a liquid crystal display apparatus, according to an example embodiment.

Referring to FIGS. 1 and 3, elements of the liquid crystal display apparatus illustrated in FIG. 3 may be substantially identical to or analogous to elements of the liquid crystal display apparatus described with reference to FIG. 1 and/or FIG. 2. Descriptions concerning substantially identical elements and/or analogous elements may not be repeated.

The liquid crystal display apparatus may include a liquid crystal display panel 100, a first inorganic insulation layer 210, a plurality of touch electrode 222, a plurality of connecting pad 224 and a second inorganic insulation layer 230.

The first inorganic insulation layer 210 may be disposed on the liquid crystal display panel 100. The touch electrode 222 may be disposed in an active area AA of the liquid crystal display panel 100. The connecting pad 224 may be disposed in a connecting area CA of the liquid crystal display panel 100. Each of the connecting pad 224 may be electrically connected to the touch electrode 222 through a connecting line 223.

The second inorganic insulation layer 230 may be disposed on the first inorganic insulation layer 210 and the touch electrode 222. The second inorganic insulation layer 230 may have a relatively large thickness for sufficiently covering the touch electrode 222 and the connecting lines 223, so that the second inorganic insulation layer 230 may have a substantially level surface. For example, the second inorganic insulation layer 230 may be formed by an additional planarization process. The second inorganic insulation layer 230 may define an opening to expose the connecting pad 224.

The touch electrode 222, the connecting lines 223 and the connecting pad 224 may include indium tin oxide ITO, and a refractive index of the connecting lines 223 and the connecting pad 224 may be about 1.9 to 2.0. The first inorganic insulation layer 210 and the second inorganic insulation layer 230 may include silicon nitride SiNx, wherein a refractive index of the second inorganic insulation layer 230 may be about 2.0.

According to the present example embodiment, difference of reflective index of the first inorganic insulation layer 210, the touch electrode 222, the connecting lines 223 and the second inorganic insulation layer 230 is relatively small. In addition, height from an upper surface of the liquid crystal display panel 100 to an upper surface of the second inorganic insulation layer 230 where the touch electrode 222 or the connecting lines 223 is formed is same as that of where the touch electrode 222 and the connecting lines 223 are not formed. Thus, so that the spot pattern due to difference of reflective index may be invisible to users. Accordingly, display quality of the liquid crystal display apparatus having the touch input device may be improved.

Figure 4:
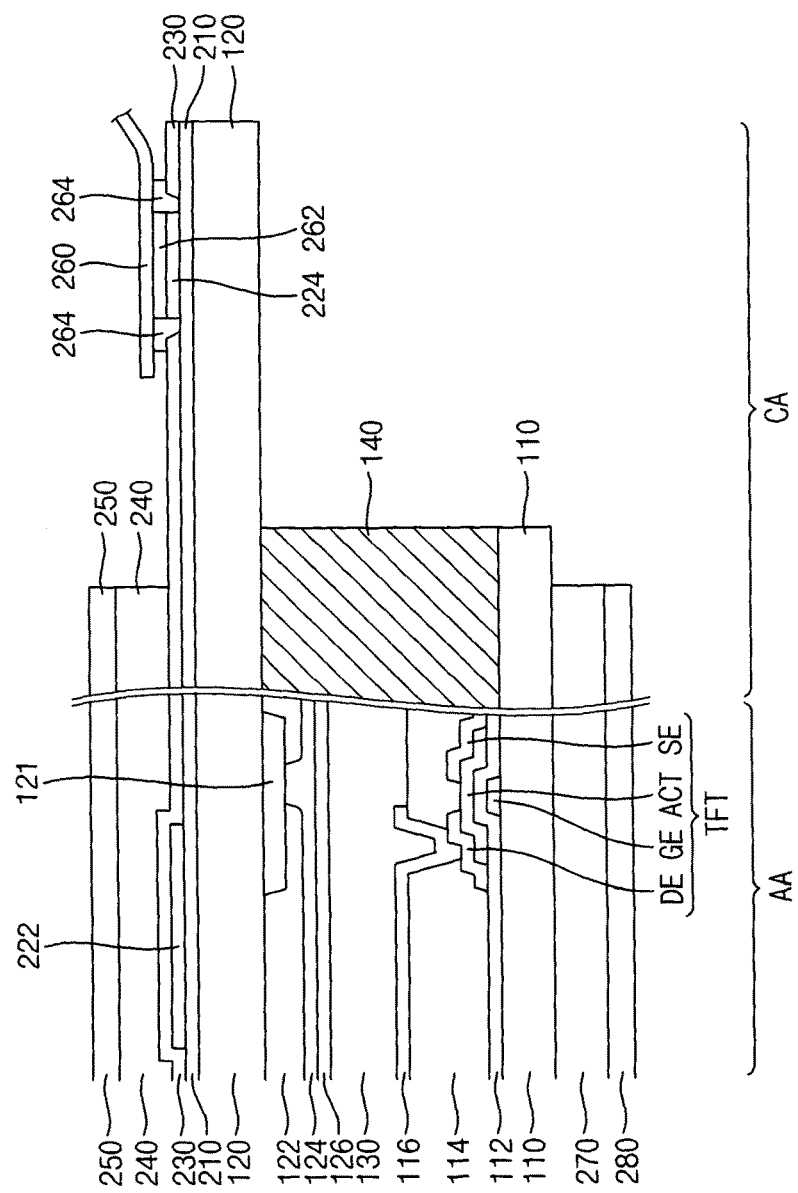
FIG. 4 is a cross-sectional view illustrating a display apparatus, e.g., a liquid crystal display apparatus, according to an example embodiment.

FIG. 4 is a cross-sectional view illustrating a display apparatus, e.g., a liquid crystal display apparatus, according to an example embodiment.

Referring to FIGS. 1 and 4, the liquid crystal display apparatus may be substantially same as the liquid crystal display apparatus of FIG. 1, except for first and second polarizer 250 and 280, a flexible circuit board and specific elements of a liquid crystal panel.

The liquid crystal display apparatus may include a liquid crystal display panel, a first inorganic insulation layer 210, a plurality of touch electrode 222, a plurality of connecting pad 224, a second inorganic insulation layer 230, a first adhesive layer 240, a first polarizer 250, a flexible circuit board 260, a second adhesive layer 270 and a second polarizer 280.

The liquid crystal display panel may include a first substrate, a second substrate and a liquid crystal layer 130 disposed between the first substrate and the second substrate.

The first substrate may include a first base substrate 110, a thin film transistor TFT, a first insulation layer 112, a second insulation layer 114 and a first electrode 116.

The first base substrate 110 may include a glass substrate, a quartz substrate, a transparent resin substrate, etc.

The thin film transistor TFT may include a gate electrode GE, a source electrode SE, a drain electrode DE and an active pattern ACT. The gate electrode GE may be disposed on the first base substrate 110.

The first insulation layer 112 may be disposed on the first base substrate 110 on which the gate electrode GE is disposed. The first insulation layer 112 may include inorganic insulation material. For example, the first insulation layer 112 may be formed using silicon nitride (SiNx), silicon oxynitride (SiOxNy), silicon carbon nitride (SiCxNy), silicon oxycarbide (SiOxCy), metal oxide and etc.

The active pattern ACT may be disposed on the first insulation layer 112. The active pattern ACT may be overlapped with the gate electrode GE. The active pattern may include a semiconductor layer consisting of amorphous silicon (a-Si:H) and an ohmic contact layer consisting of n+ amorphous silicon (n+ a-Si:H). In addition, the active pattern may include an oxide semiconductor. The oxide semiconductor may include an amorphous oxide.

The source electrode SE and the drain electrode DE may be disposed on the first insulation layer 112 on which the active pattern ACT is disposed. The source electrode may be electrically connected to the active pattern ACT. The drain electrode DE may be spaced apart from the source electrode SE, and electrically connected to the active pattern ACT.

The second insulation layer 114 may be disposed on the first insulation layer 114 on which the active pattern ACT, the source electrode SE and the drain electrode DE. The second insulation layer 114 may include inorganic insulation material. An upper surface of the second insulation layer 114 may sufficiently cover the active pattern ACT, the source electrode SE and the drain electrode DE and have a substantially level surface The first electrode 116 may be disposed on the second insulation layer 114. The first electrode 116 may be electrically connected to the drain electrode DE through a contact hole formed through the second insulation layer 114. The first electrode 116 may include a transparent conductive material. For example, the first electrode 116 may include indium tin oxide (ITO), indium zinc oxide (IZO) and etc.

The second substrate may include a second base substrate 120, a black matrix 121, a color filter 122, an over-coating layer 124 and a second electrode 126.

The second base substrate 120 may include a glass substrate, a quartz substrate, a transparent resin substrate, etc.

The black matrix 121 may be disposed on the second base substrate 120. The black matrix 121 may include a material which blocks light. The black matrix 121 may be disposed to overlap the thin film transistor TFT.

The color filter 122 may be disposed on the second substrate 120 on which the black matrix 121 is disposed. The color filter 122 supplies colors to the light passing through the liquid crystal layer 130. The color filter 122 may include a red color filter, a green color filter and blue color filter. The color filter 122 is provided corresponding to a pixel. The color filters adjacent to each other may have different colors.

The over-coating layer 124 may be disposed on the color filter 122 and the black matrix 121. The over-coating layer 124 may flatten, protects, and insulates the color filter 122.

The second electrode 126 may be disposed on the over-coating layer 124. The second electrode 126 may be disposed to face the first electrode 116. The second electrode 126 may include transparent conductive material. For example, the second electrode 126 may include indium tin oxide (ITO), indium zinc oxide (IZO) and etc.

The liquid crystal layer 130 may be disposed between the first substrate and the second substrate. The liquid crystal layer 130 includes liquid crystal molecules having optical anisotropy. The liquid crystal molecules are driven by electric field, so that an image is displayed by passing or blocking light through the liquid crystal layer 130.

The liquid crystal layer 130 may be sealed by a sealing member 140 formed between the first base substrate 110 and the second base substrate 120 at edges of the liquid crystal display panel.

The first inorganic insulation layer 210 may be disposed on the second substrate 120 and opposite to the liquid crystal layer 130 with respect to the second substrate 120. The first inorganic insulation layer 210 may include an inorganic insulation material.

The touch electrode 222 may be disposed on an active area AA of the liquid crystal display panel 100. The connecting pad 224 may be disposed in a connecting area CA of the liquid crystal display panel 100. Each of the connecting pad 224 may be electrically connected to each of the touch electrode 222 through a connecting line 223. The second inorganic insulation layer 230 may be disposed on the first inorganic insulation layer 210 and the touch electrode 222.

The second inorganic insulation layer 230 may define an opening which exposes the connecting pad 224. In a plan view, the opening may be formed larger than the connecting pad 224. Accordingly, the second inorganic insulation layer 230 may be spaced apart from the connecting pad 224.

The first adhesive layer 240 may be disposed on the second inorganic insulation layer 230 in the active area AA. The first adhesive layer 240 is for attaching the first polarizer 250 to the second substrate. For example, the first adhesive layer 240 may include pressure sensitive adhesive (PSA).

The first polarizer 250 may be disposed on the first adhesive layer 240. The first polarizer 250 may polarize light.

The flexible circuit board 260 may be electrically connected to the connecting pad 262. The flexible circuit board 260 may include a drive IC (not shown), or electrically connected to the drive IC. Accordingly, the touch electrode 222 may be electrically connected to the drive IC for driving the touch electrode 222 through the connecting lines 223, the connecting pad 224 and the flexible circuit board 260. A connecting electrode 262 formed on the flexible circuit board 260 may be electrically connected to the connecting pad 224 through a sealing member 264 which includes a conductive ball or by contacting to the connecting pad 224.

The second adhesive layer 270 may be disposed on the first substrate 110 in the active area AA and opposite to the liquid crystal layer 130 with respect to the first substrate 110. The second adhesive layer 270 is for attaching the second polarizer 280 to the first substrate. For example, the second adhesive layer 270 may include pressure sensitive adhesive (PSA).

The second polarizer 280 may be disposed on the second adhesive layer 270. The second polarizer 280 may polarize light. A polarizing axis of the first polarizer 250 may be perpendicular to a polarizing axis of the second polarizer 280.

The liquid crystal display apparatus is driven in a VA mode (vertical alignment) in an example embodiment. In an embodiment, the liquid crystal display panel may be in one or more of various driving modes.

FIGS. 5A to 5H are cross-sectional views illustrating a method of manufacturing the display apparatus, e.g., a liquid crystal display apparatus, of FIG. 4 according to one or more example embodiments.

Figure 5A:
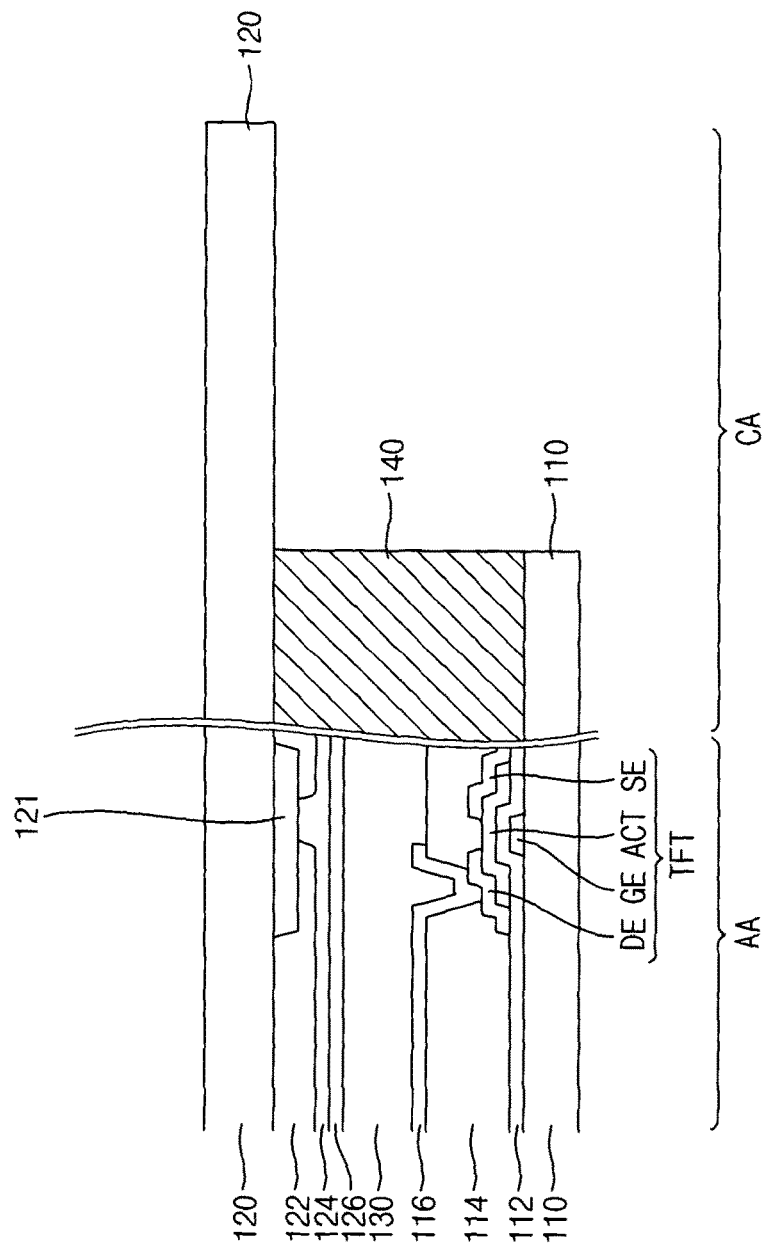

Referring to FIG. 5A, a liquid crystal display panel including a first substrate, a second substrate, and a liquid crystal layer disposed between the first substrate and the second substrate may be provided. The first substrate may include a first base substrate 110, a thin film transistor TFT, a first insulation layer 112, a second insulation layer 114 and a first electrode 116. The thin film transistor TFT may include a gate electrode GE, an active pattern ACT, a source electrode SE and a drain electrode DE. The second substrate may include a second base substrate 120, a black matrix 121, a color filter 122, an over-coating layer 124 and a second electrode 126.

The liquid crystal display panel may be formed by locating the first substrate and the second substrate to face each other, and then injecting a liquid crystal layer between the first substrate and the second substrate, and then sealing the liquid crystal layer using a sealing member 140.

Referring to FIG. 5B, a first inorganic insulation layer 210 may be formed on the second base substrate 120 opposite to the liquid crystal layer 130 with respect to the second base substrate 120. The first inorganic insulation layer 210 may include inorganic insulation material. The first inorganic insulation layer 210 may be formed under about 130 degrees Celsius. For example, the first inorganic insulation layer 210 may include silicon oxide (SiOx) or silicon nitride (SiNx), and may be formed by a chemical vapor deposition process under about 130 degrees Celsius.

Subsequently, a transparent conductive layer 220 may be formed on the first inorganic insulation layer 210. The first inorganic insulation layer 210 may include a transparent conductive material, and may be formed at or below 130 degrees Celsius. For example, the transparent conductive layer 220 may include indium tin oxide (ITO) and may be formed by a low temperature sputtering process performed at or below 130 degrees Celsius.

In an embodiment, the second base substrate 120 may be prevented from directly contacting the transparent conductive layer 220 by the first inorganic insulation layer 210. The transparent conductive layer 220 may be uniformly formed by the first inorganic insulation layer 210 even if particles remain on the first base substrate 120. Therefore, satisfactory quality of touch electrodes and connecting lines subsequently formed from the transparent conductive layer 220 may be attained.

Figure 5C:
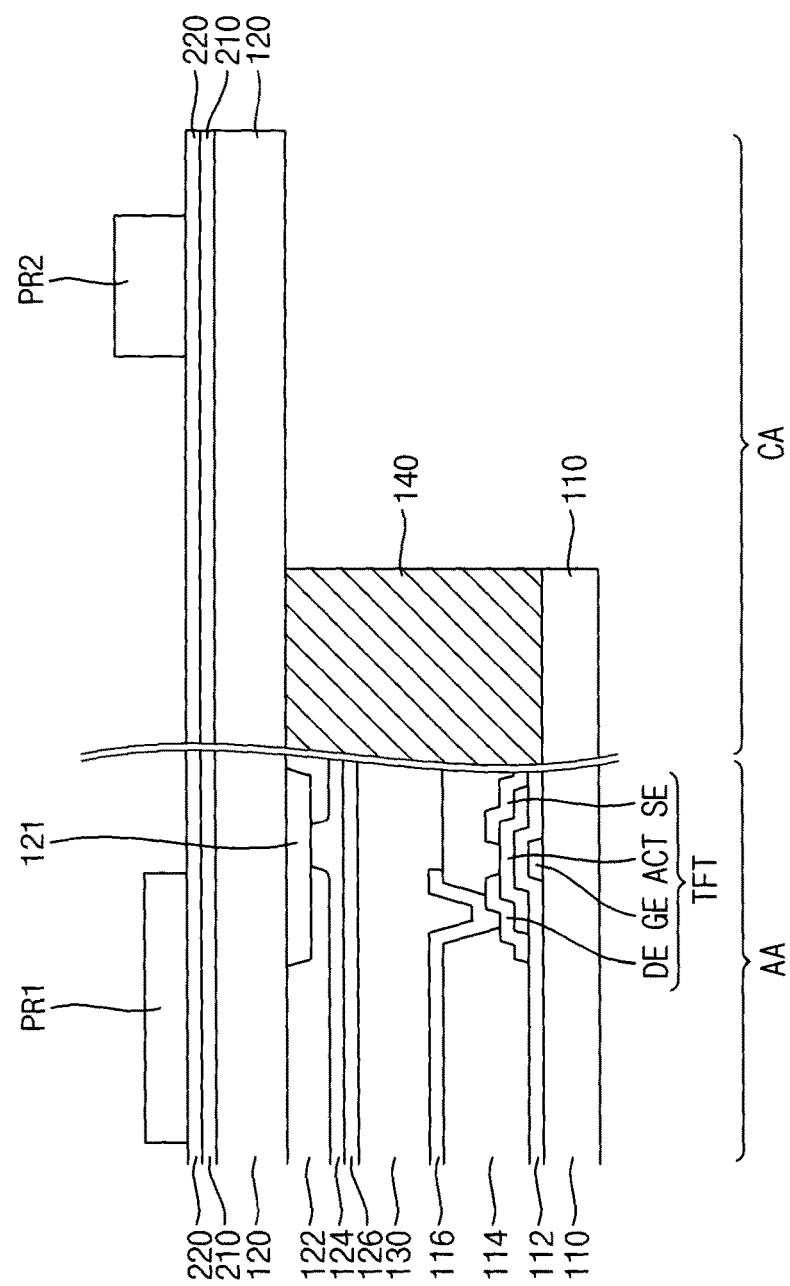

Referring to FIG. 5C, a first photoresist pattern PR1 and a second photoresist member PR2 may be formed on the transparent conductive layer 220. The first photoresist member PR1 may be formed in an active area AA, and the second photoresist member PR2 may be formed in a connecting area CA. The first photoresist member PR1 may have a smaller height and/or a smaller thickness than the second photoresist member.

A photoresist layer may be formed on the transparent conductive layer 220, and then the first and second photoresist members PR1 and PR2 may be formed by exposure and development of the photoresist layer using a half-tone mask. Accordingly, the first photoresist member PR1 and the second photoresist member PR2 having larger height than the first photoresist member PR1 may be formed.

Figure 5D:
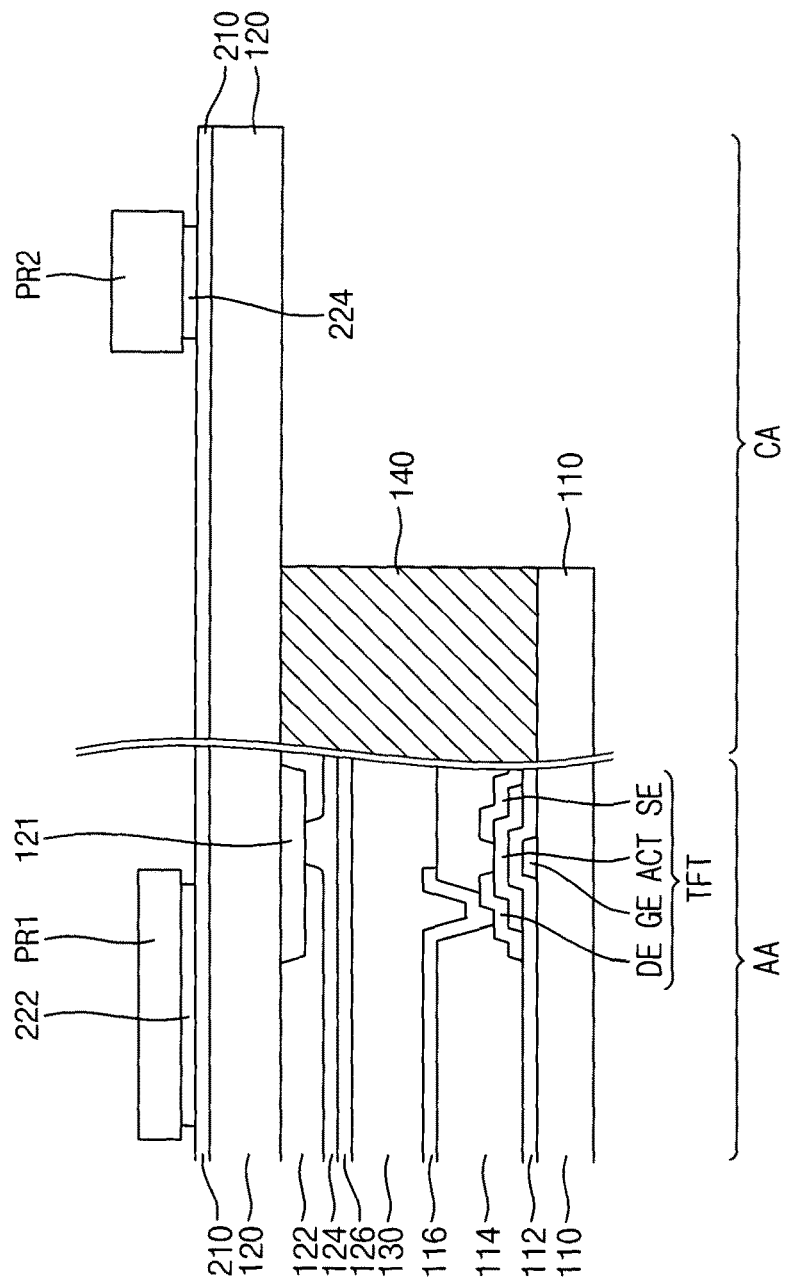

Referring to FIG. 5D, the transparent conductive layer 220 may be processed using the photoresist members PR1 and PR2 as masks. Accordingly, a touch electrode 222, a connecting line (e.g., the connecting line 223 illustrated in FIG. 1) and a connecting pad 224 may be formed. For example, the transparent conductive layer 220 may be wet-etched using the photoresist members PR1 and PR2 as an etch barrier. Accordingly, the touch electrode 222, the connecting line and the connecting pad 224 may be formed under the photoresist members PR1 and PR2.

In an embodiment, by controlling the wet-etching condition, an under-cut may be formed between the second photoresist member PR2 and the connecting pad 224. Thus, in a cross-sectional view, a width of the connecting pad 224 may be smaller than a width of the second photoresist member PR2.

Figure 5E:
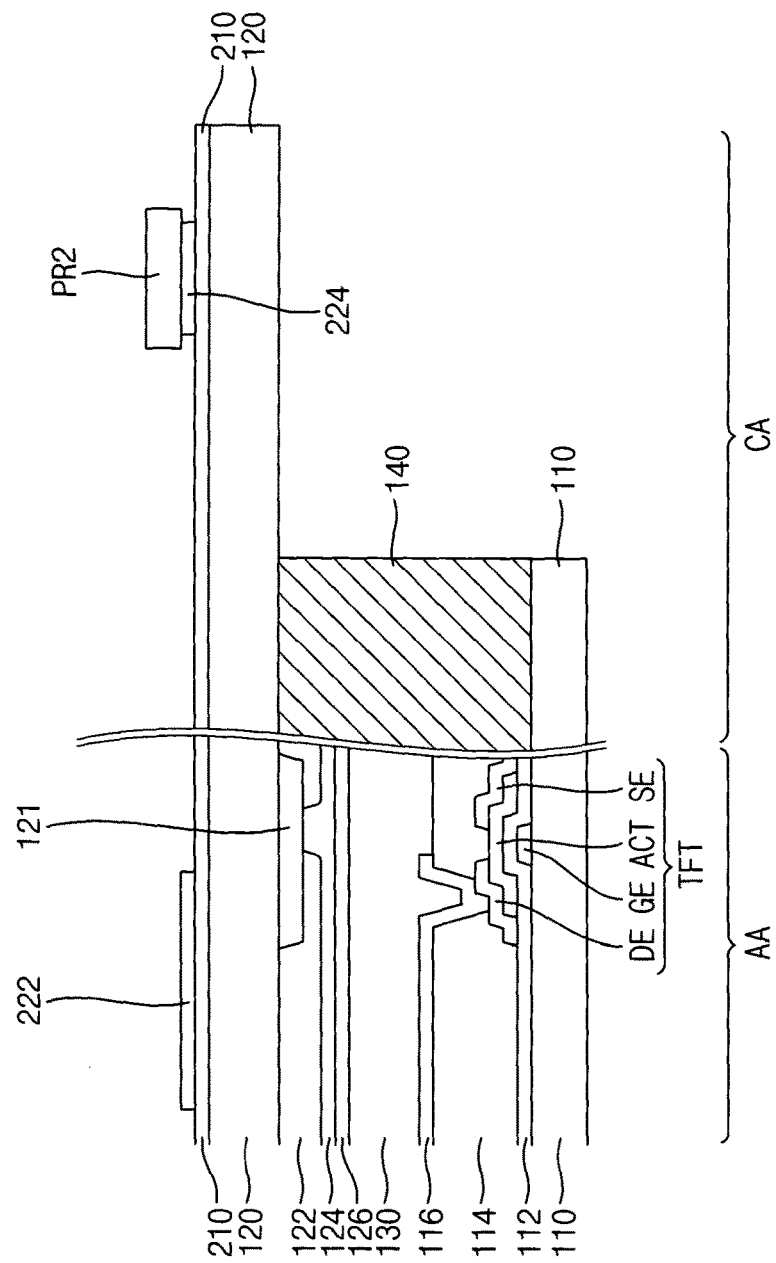

Referring to FIG. 5E, the first photoresist member PR1 may be removed. For example, the first photoresist member PR1 may be removed using an ashing process. In an embodiment, a width and/or a thickness of the second photoresist member PR2 is larger than that of the first photoresist member PR1, so that the first photoresist member PR1 may be totally removed, and the second photoresist member PR2 may partially remain after the ashing process has been performed to both the photoresist members PR1 and PR2.

Figure 5F:
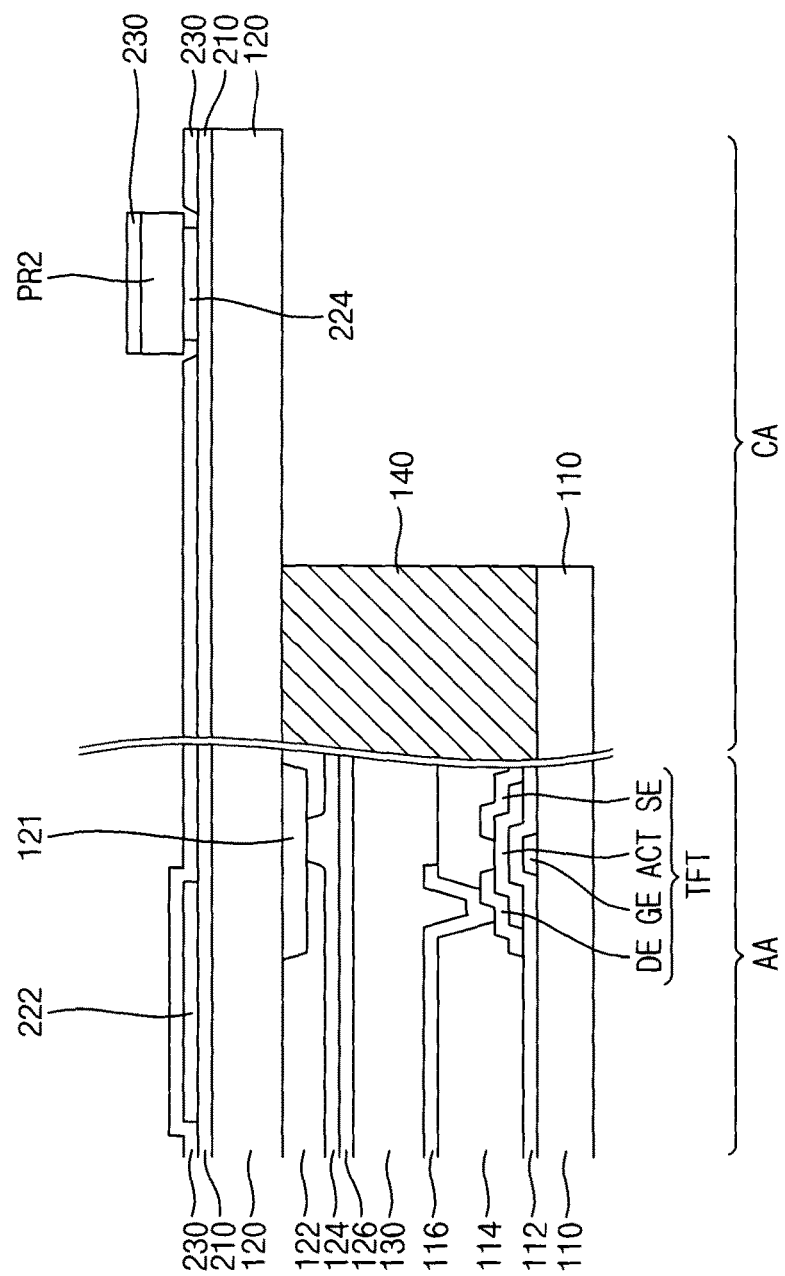

Referring to FIG. 5F, a second inorganic insulation layer 230 may be formed on the touch electrode 222, the first inorganic insulation layer 210, and the remaining second photoresist member PR2. The second inorganic insulation layer 230 may include inorganic insulation material. The second inorganic insulation layer 230 may be formed under about 130 degrees Celsius. For example, the second inorganic insulation layer 230 may include silicon oxide (SiOx) or silicon nitride (SiNx), and may be formed using a chemical vapor deposition process under about 130 degrees Celsius.

In an embodiment, an under-cut is formed between the second photoresist member PR2 and the connecting pad 224, so that the second inorganic insulation layer 230 may be cut at an edge of the second photoresist member PR2, and may be spaced from the connecting pad 224.

Referring to FIG. 5G, the second photoresist member PR2 and a portion of the second inorganic insulation layer 230 on the second photoresist member PR2 may be removed. For example, the second photoresist member PR2 may be removed using a lift-off process. In an embodiment, an under-cut is formed between the second photoresist member PR2 and the connecting pad 224, so that the second photoresist member PR2 may be easily removed and the connecting pad 224 may be exposed.

Figure 5H:
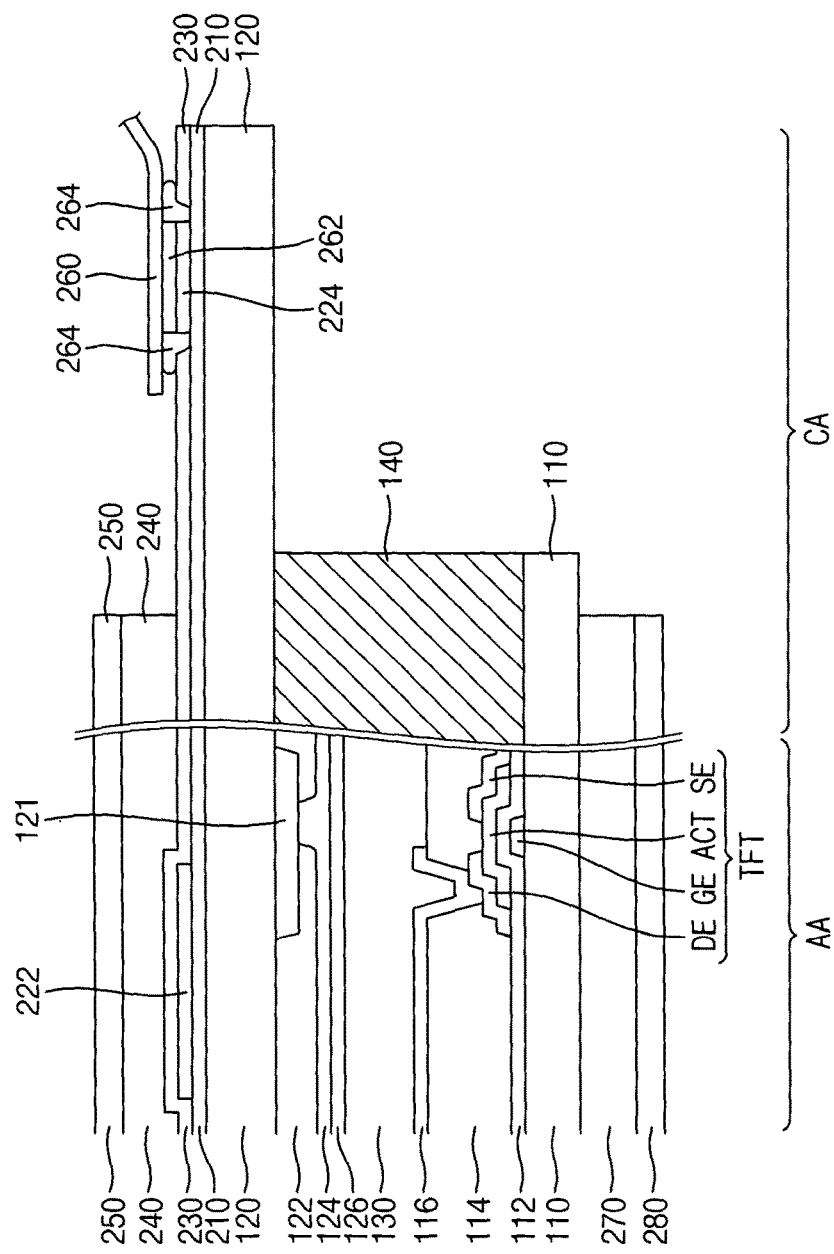

Referring to FIG. 5H, a flexible printed circuit board 260 may be connected to the connecting pad 224. The flexible printed circuit board 260 may include a drive IC (not shown) and a connecting electrode 262. For example, the connecting electrode 262 of the flexible printed circuit board 260 may directly make contact with the connecting pad 224 or electrically connected to the connecting pad 224 by a conductive sealing member 264 including conductive balls.

A first polarizer 250 may be attached on the second inorganic insulation layer 230 in the active area AA. The first polarizer 250 may be attached on the first substrate by a first adhesive layer 240 between the second inorganic insulation layer 230 and the first polarizer 250.

A second polarizer 280 may be attached on the first base substrate 110 in the active area AA. The second polarizer 280 may be attached on the second substrate by a second adhesive layer 270 between the first base substrate 110 and the second polarizer 280.

The whole processes described with reference to FIGS. 5B to 5H may be performed under about 130 degrees Celsius. Arrangement of the liquid crystal molecules having optical anisotropy in the liquid crystal layer 130 may lose its optical property in a high temperature. Therefore, the above processes may preferably be performed under about 130 degrees Celsius.

According to embodiments, a display apparatus, e.g., a liquid crystal display apparatus, includes a first inorganic insulation layer, a touch electrode, a connecting line, a connecting pad, and a second inorganic insulation layer. Differences of refractive indexes associated with the first inorganic insulation layer, the touch electrode, the connecting pad, and the second inorganic insulation layer are relative small, so that substantially no conspicuous spot pattern potentially formed due to reflective index differences may be visible or noticeable to users. Advantageously, display quality of the display apparatus having a touch input device may be satisfactory.

In embodiments, a method of manufacturing the display apparatus, e.g., a liquid crystal display apparatus, includes forming first and second photoresist members having different thicknesses, wherein a remaining portion of the second photoresist member is removed using a lift-off process, so that the overall process can be substantially simple, efficient, and/or effective.

In embodiments, the touch electrode and the connecting line are formed on the first inorganic insulation layer, so that defects potentially caused by particles formed from a previous process may be minimized or substantially prevented.

Although certain embodiments have been described, other embodiments and modifications will be apparent from this description. Practical embodiments are not limited to the described embodiments. The scope of the claims includes various modifications and equivalent arrangements.

What is claimed is:

1. A method of manufacturing a liquid crystal display apparatus, comprising:
    providing a first substrate;
    providing a second substrate;
    forming a liquid crystal layer between the first substrate and the second substrate;
    forming a first inorganic insulation layer on the second substrate after forming the liquid crystal layer;
    forming a transparent conductive layer on the first inorganic insulation layer;
    forming a first photoresist pattern and a second photoresist pattern having a larger thickness than the first photoresist pattern on the transparent conductive layer;
    forming a touch electrode under the first photoresist pattern and a connecting pad under the second photoresist pattern by patterning the transparent conductive layer using the first and second photoresist patterns;
    removing the first photoresist pattern;
    forming a second inorganic insulation layer on the touch electrode, the first inorganic insulation layer and the second photoresist pattern; and
    removing the second photoresist pattern and a portion of the second inorganic insulation layer on the second photoresist pattern, wherein an opening is formed through the second inorganic insulation layer to expose the connecting pad and a portion of the first inorganic insulation layer between two opposite wall sections of the opening, and wherein the connecting pad and the portion of the first inorganic insulation layer are positioned between the two opposite wall sections of the opening in a direction parallel to the first substrate.

2. The method of claim 1, wherein the liquid crystal layer is sealed by a sealing member, and wherein a portion of the transparent conductive layer overlaps the sealing member and is exposed between the first photoresist pattern and the second photoresist pattern.

3. The method of claim 1, wherein forming the first and second photoresist patterns comprises:
    forming a photoresist layer on the transparent conductive layer; and
    performing exposure and development of photoresist layer using a half-tone mask.

4. The method of claim 1, wherein forming the first inorganic insulation layer, forming the transparent conductive layer, forming the first and second photoresist patterns, forming the touch electrode and the connecting pad, removing the first photoresist pattern, forming the second inorganic insulation layer, and removing the second photoresist pattern are all performed below 130 degrees Celsius.

5. The method of claim 1, wherein removing the first photoresist pattern comprises removing the first photoresist pattern which has relative small thickness by overall ashing process to the first and second photoresist patterns, and remaining the second photoresist pattern which has relative large thickness.

6. The method of claim 1, wherein differences of refractive indexes among the first inorganic insulation layer, the second inorganic insulation layer and the transparent conductive layer are each less than 0.1.

7. The method of claim 1, wherein the connecting pad is spaced from each of the two opposite wall sections of the opening, and wherein the first inorganic insulation layer directly contacts both the two opposite wall sections of the opening.

8. The method of claim 1, wherein the first substrate comprises a thin film transistor, and the second substrate comprises a color filter.

9. The method of claim 1, further comprising:
    connecting a flexible printed circuit board to the connecting pad; and
    attaching a polarizer on the second inorganic insulation layer.

10. The method of claim 1, wherein in forming the touch electrode and the connecting pad, a width of the second photoresist pattern is larger than a width of the connecting pad in a cross-sectional view, so that an under-cut is formed between the second photoresist pattern and the connecting pad.

11. The method of claim 10, wherein forming the touch electrode and the connecting pad is performed by a wet-etch process.

12. The method of claim 1, wherein the first inorganic insulation layer and the second inorganic insulation layer comprise silicon oxide (SiOx) or silicon nitride (SiNx).

13. The method of claim 12, wherein forming the first inorganic insulation layer and forming the second inorganic insulation layer are performed by a chemical vapor deposition process.

14. The method of claim 13, wherein the chemical vapor deposition process is performed below 130 degrees Celsius.

* * * * *